United States Patent
Graf et al.

(10) Patent No.: US 7,094,674 B2
(45) Date of Patent: Aug. 22, 2006

(54) METHOD FOR PRODUCTION OF CONTACTS ON A WAFER

(75) Inventors: Werner Graf, Dresden (DE); Henning Haffner, Dresden (DE); Johannes Kowalewski, Dresden (DE); Lars Heineck, Dresden (DE)

(73) Assignee: Infineon Technologies AG, Munich (DE)

( * ) Notice: Subject to any disclaimer, the term of this patent is extended or adjusted under 35 U.S.C. 154(b) by 129 days.

(21) Appl. No.: 10/739,477

(22) Filed: Dec. 18, 2003

(65) Prior Publication Data

US 2004/0142548 A1 Jul. 22, 2004

(30) Foreign Application Priority Data

Dec. 18, 2002 (DE) ................................ 102 59 634

(51) Int. Cl.
*H01L 21/44* (2006.01)
(52) U.S. Cl. .................. 438/598; 438/128; 438/618; 438/652; 438/669
(58) Field of Classification Search ................ 438/128, 438/129, 598, 618, 622, 629, 597, 665, 666, 438/669–673, 257, 587, 588, 652
See application file for complete search history.

(56) References Cited

U.S. PATENT DOCUMENTS

| | | | |
|---|---|---|---|
| 5,139,924 A * | 8/1992 | Svensson | 430/314 |
| 5,289,037 A | 2/1994 | Savignac et al. | |
| 5,482,894 A | 1/1996 | Havemann | |
| 5,672,894 A | 9/1997 | Maeda et al. | |
| 5,835,396 A * | 11/1998 | Zhang | 365/51 |
| 5,959,321 A * | 9/1999 | Lee et al. | 257/296 |
| 6,262,487 B1 | 7/2001 | Igarashi et al. | |
| 6,353,190 B1 * | 3/2002 | Sumida et al. | 174/261 |
| 6,390,830 B1 * | 5/2002 | Onizuka | 439/76.2 |
| 6,525,953 B1 * | 2/2003 | Johnson | 365/63 |
| 6,567,287 B1 * | 5/2003 | Scheuerlein | 365/51 |
| 6,607,944 B1 * | 8/2003 | Tran et al. | 438/129 |
| 6,621,110 B1 * | 9/2003 | Matsuoka et al. | 257/296 |
| 6,731,557 B1 * | 5/2004 | Beretta | 365/222 |
| 6,737,675 B1 * | 5/2004 | Patel et al. | 257/67 |
| 6,768,661 B1 * | 7/2004 | Vyvoda et al. | 365/51 |
| 6,780,711 B1 * | 8/2004 | Johnson et al. | 438/257 |
| 2002/0034877 A1 | 3/2002 | Shin et al. | |

FOREIGN PATENT DOCUMENTS

| | | |
|---|---|---|
| JP | 60-64448 | 4/1985 |
| JP | 3-76121 | 4/1991 |
| JP | 9-213609 | 8/1997 |
| WO | WO 01/09946 A1 | 2/2001 |

* cited by examiner

*Primary Examiner*—Zandra V. Smith
*Assistant Examiner*—Khanh Duong
(74) *Attorney, Agent, or Firm*—Slater & Matsil, L.L.P.

(57) ABSTRACT

The invention relates to a method for production of contacts on a wafer, preferably with the aid of a lithographic process. The preferred embodiment provides a method which overcomes the disadvantages of the complex point/hole lithography process, and which avoids any increase in the process complexity. This method is achieved in that a strip structure extending over two layers is used to structure the contacts. The strip structure in the first layer is rotated at a predetermined angle with respect to the strip structure in the second layer, and the contacts are formed in the mutually overlapping areas of the strip structures in the two layers.

12 Claims, 3 Drawing Sheets

METHOD FOR PRODUCTION OF CONTACTS ON A WAFER

TECHNICAL FIELD

The invention relates to a method for production of contacts on a wafer, and more preferably to a method for production of contacts on a wafer with the aid of a lithographic process.

BACKGROUND

When memory cells are produced in matrix-like arrangements, it is necessary to make contact between each cell and a row and a column line. In order to produce these connections, the cells have to be provided with contacts, which are electrically conductively connected to the lines.

As is described in U.S. Pat. No. 5,482,894 and international application WO 01/09946 A1, when manufacturing DRAM circuits according to the prior art, contacts in the cell array are produced by using a plug/hole mask in a lithographic process. After an exposure and development process, holes are etched in the dielectric between the first metallization layer and the diffusion layer. The etching is in this case carried out selectively for gate encapsulation.

The hole masks which are required for this method are difficult to produce lithographically with the necessary size and accuracy. A further disadvantage occurs as the contact holes become smaller. The subsequent selective etching of the holes as far as the gate encapsulation is more difficult for small structures.

WO 01/09946 A1 describes a method for production of integrated semiconductor components. The necessary contacts are produced first by forming the desired contact as a sacrificial poly-silicon DOT, then by embedding this DOT in BPSG in a subsequent process, and by later removing the sacrificial poly-silicon once again. The contact holes are then filled with a conductive material, thus forming a conductive connection.

In this method, the distance between the structures is very small, owing to the progress in the miniaturization of the memory structures and the use of a checkerboard design. This improves the capability to form resist feet between the resist DOTs that are produced. A disadvantage of the method is that the resist DOTs which are required in the meantime are relatively high, as isolated structures, and can easily fall down.

SUMMARY OF THE INVENTION

A preferred embodiment of the invention provides a method which overcomes the disadvantages of the complex plug/hole lithography process, and which avoids any increase in the process complexity.

The preferred embodiment provides a method of forming a semiconductor device, such as a dynamic random access memory. A surface, e.g., a silicon substrate, includes a plurality of contacts, e.g., bitline contacts, laid out in a matrix of rows and columns. A first plurality of strips is formed over the surface. Each strip in the first plurality is disposed along a diagonal of the matrix. A second plurality of strips is formed over the surface and over the first plurality of strips. Each strip in the second plurality is disposed along a row of the matrix. Contacts can be formed by removing portions of the first plurality of strips not underlying the second plurality of strips.

One advantageous embodiment of the invention provides for the production of strip structures by means of a lithographic process, using a first and a second exposure mask, each mask having a parallel strip structure.

Another advantageous embodiment of the invention provides for the strip structure to be corrugated or to be provided with corrections in selected areas in a layer which are predetermined by the chip design.

A further embodiment of the invention provides for the parallel strip structure in one layer to have a greater distance between one strip center and an adjacent strip center than the strip structure in another layer.

Another embodiment of the invention provides for the width of the strips in one strip structure to be the same as that of the width of the strips in another strip structure, and for the space between the strips of one strip structure to be greater than the space between the strips in another strip structure.

A further embodiment of the invention provides for a rotated strip structure wherein the rotated strip structure has the greater space between the strips.

Another embodiment of the invention provides for the contacts to be formed by over-etching the space between the M0 strip structures, with the CB strip structures being cut through.

A further embodiment of the invention provides for the M0 strip structure to form row lines for the memory cells which are arranged in the same row.

Another advantageous embodiment of the invention provides for positive resist or negative resist to be used for the lithography step.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Aspects of the present invention will now be described. The preferred embodiment will first be described textually. A specific example will then be discussed with respect to FIG. 1.

Figure 1:
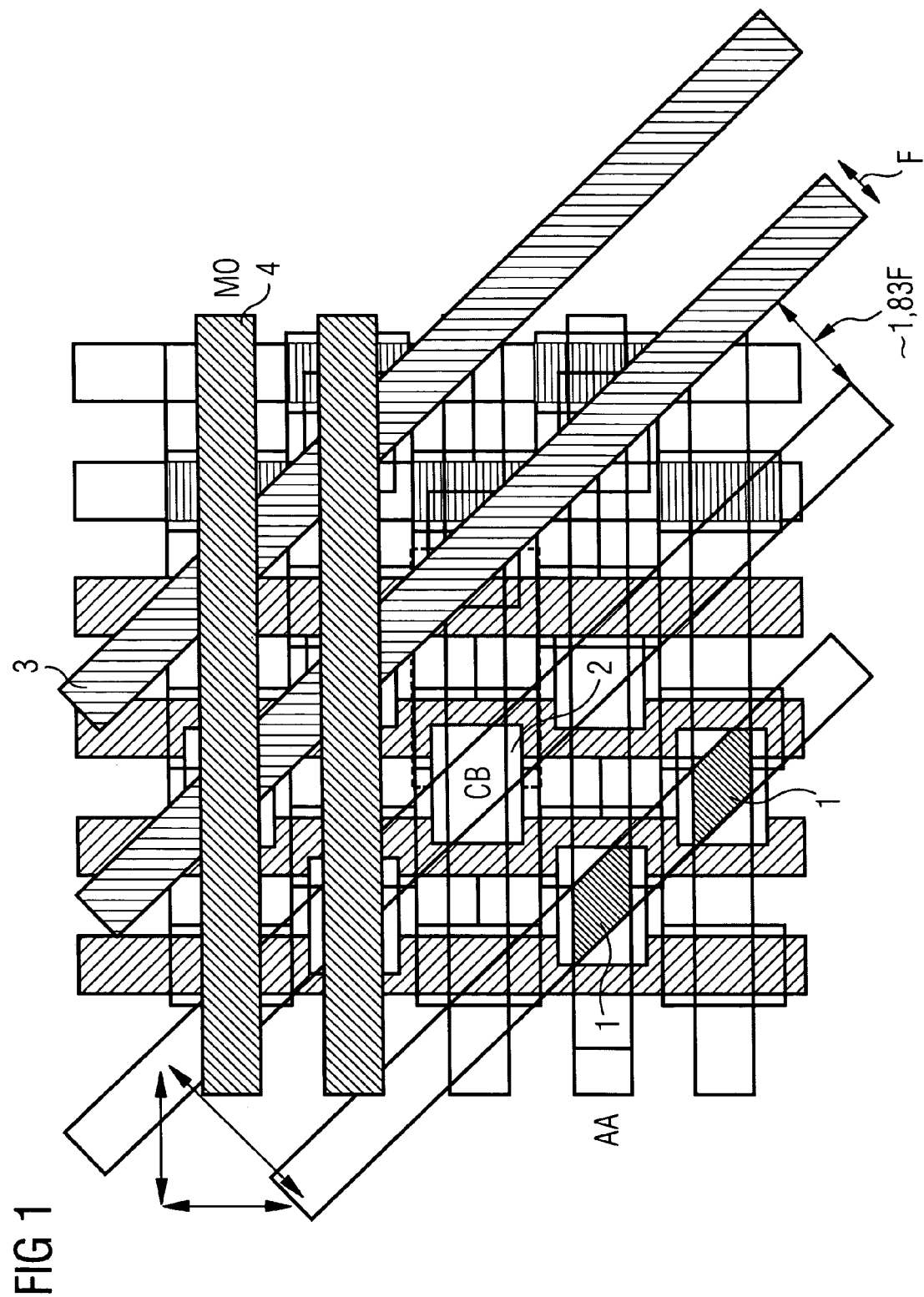
FIG. 1 shows a structure layer on the wafer by means of strip structures in various layers.

According to the present invention, the preferred embodiment method is achieved by using strip structures extending over two layers for the structuring of the contacts. The strip structure in the first layer is rotated at a predetermined angle with respect to the strip structure in the second layer, and the contacts are formed in the mutually overlapping areas of the strip structures in the two layers. An example of the structure is shown in FIG. 1, which will be discussed in greater detail below.

In this case, a strip structure is used in one layer and is aligned at an angle of, for example, 45 degrees with respect to the base layer of the chips. This strip structure is designed using a checkerboard arrangement such that the strips lie over the CB (bitline contact) surfaces of the memory cells. The cells are electrically connected to one another by means of these strips. A second layer, which is arranged above the first layer, is aligned in the direction of the base layer of the chips. This alignment of the layers results in areas which are covered not only by the strip structure in the first layer but also by the strip structure in the second layer. In a subsequent method step, the strip structure of the lower, rotated layer is cut through at those points which are not covered by the upper strip structure, and the overlapping portion is used to form the desired contacts to a structure which is located deeper on the wafer. An appropriate configuration of the uppermost strip structure allows it to connect the contacts that are produced to one another, for example as a row line.

The strips are formed by using two exposure masks. Once a number of preparatory method steps have been completed, for example those used for the production of DRAM memory cells, a positive or negative resist is applied. Then a first exposure mask is used in a lithographic method step to produce the first parallel strip structure which, after the development process and depending on the photoresist that is used, corresponds to the CB tracks or the trenches between the tracks. The tracks or trenches are placed at an angle of 45 degrees with respect to the base layer of the chips. After a number of method steps, the uppermost metallization layer (M0) is structured. This layer is also in the form of strips, with the alignment of these strips, with respect to the base layer of the chips, being zero degrees.

The contact is formed at the points at which the parallel strips of the two structures overlap. This assumes that the strip structures be placed at an angle to one another. In the preferred embodiment, the angle between the strip structures is 45 degrees. Angles other than that of 45 degrees may also be used, so long as the chosen angle allows contact to be made at the necessary points. Each memory cell design will determine what angles can be used.

After the structuring of the metallization layer M0 (e.g., the level of metal closest to the semiconductor body), the CB tracks which are located underneath it are cut through by over-etching the space between the M0 tracks, so that the contacts remain as CB plugs. The process of cutting through by means of M0 over-etching is possible since the CB tracks lead over encapsulated GC (gate contact) tracks by virtue of the checkerboard design in the M0 intermediate space, so that the etching need not be continued as far as the substrate.

Figure 2:
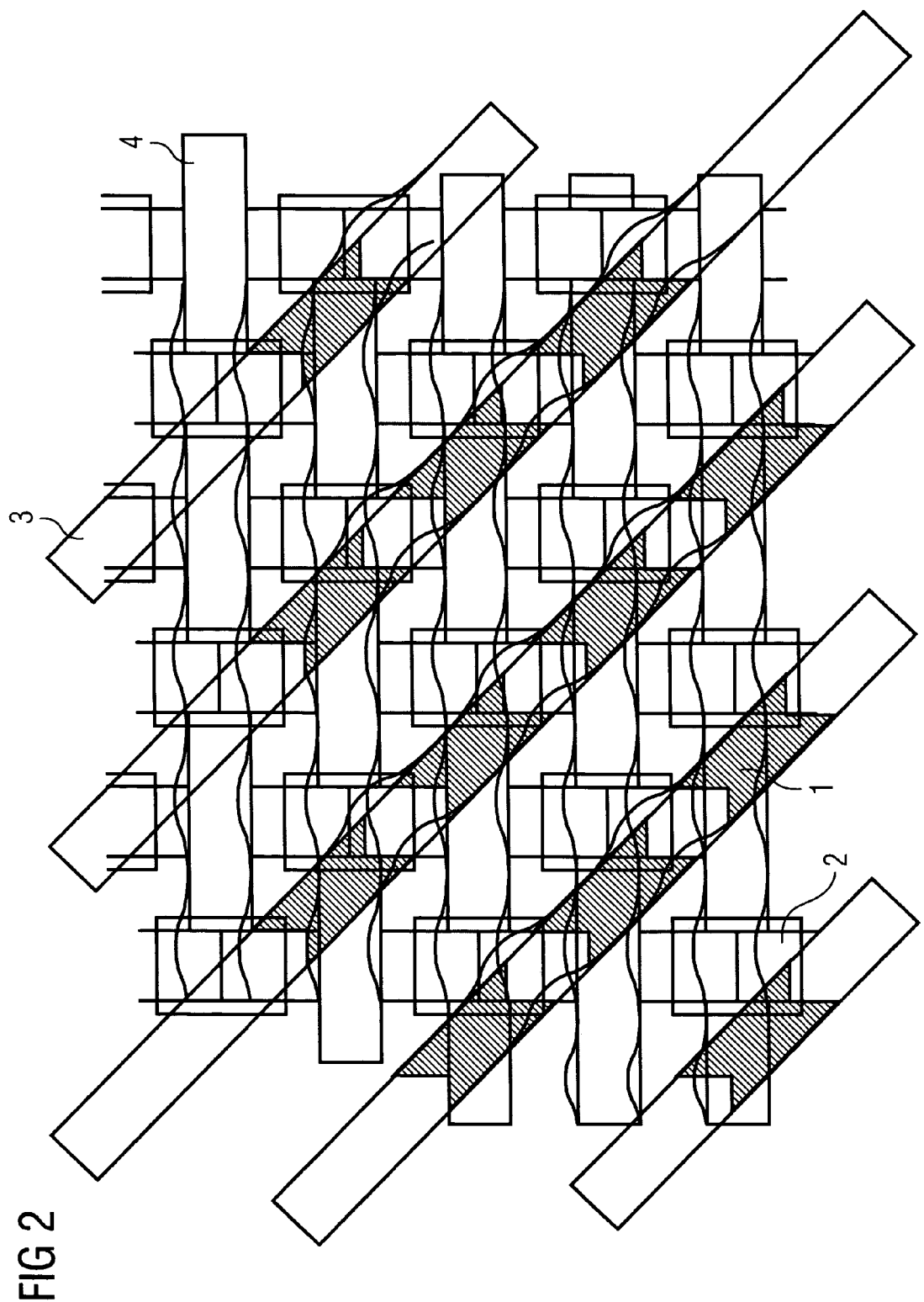
FIG. 2 shows two layers of the parallel strip structures with a corrugated strip profile.

In the checkerboard design used for producing the contacts, the distances between adjacent structures become even smaller by doubling the number of contacts. In order to reduce the increased risk of a short circuit between the structures resulting from this effect, for example the shortening of the distance between the CB layer and the AA (active area) layer or else between adjacent cells, the linear profile of the strips may be modified to a corrugated profile as shown in FIG. 2. A further possibility is to use partially regular corrections of the strips in accordance with the requirements of the respective chip design.

The distance between the parallel strips, also referred to as the pitch, is measured from the track center of one strip to the track center of an adjacent strip. Due to the chip design, for a layer which is rotated 45 degrees, the distance increases by the square root of two. If the width of the strips with respect to the other layer remains the same, the free space between the strips is thus increased.

The M0 strip structure may also form row lines for the memory cells which are arranged in the same row. The memory cells which are arranged in a matrix make contact with a row line and a column line, with the function of the row line being provided by the M0 strip structure, which is structured according to the method provided herein.

Referring now to FIG. 1, the preferred method provided herein is based on the assumption that the structures of the individual memory cells have been formed in a checkerboard arrangement and that the contacts 1 which are required for writing to and reading from the individual cells are to be formed.

In the preferred embodiment, the contacts 1 are formed on the surfaces 2, which are identified by "CB". In order to produce the contact structures, a structure comprising parallel strips is formed by means of a first exposure mask using a lithographic process. These parallel strips form tracks which lead over the CB surfaces of the memory cells and connect them to one another at an angle of 45 degrees to the basic grid. This structure of the CB tracks 3 is formed from a resist track or trench, depending on the resist that is used, after an exposure and development process, and is formed by appropriate subsequent process steps, depending on the requirements for the chip.

Figure 3:
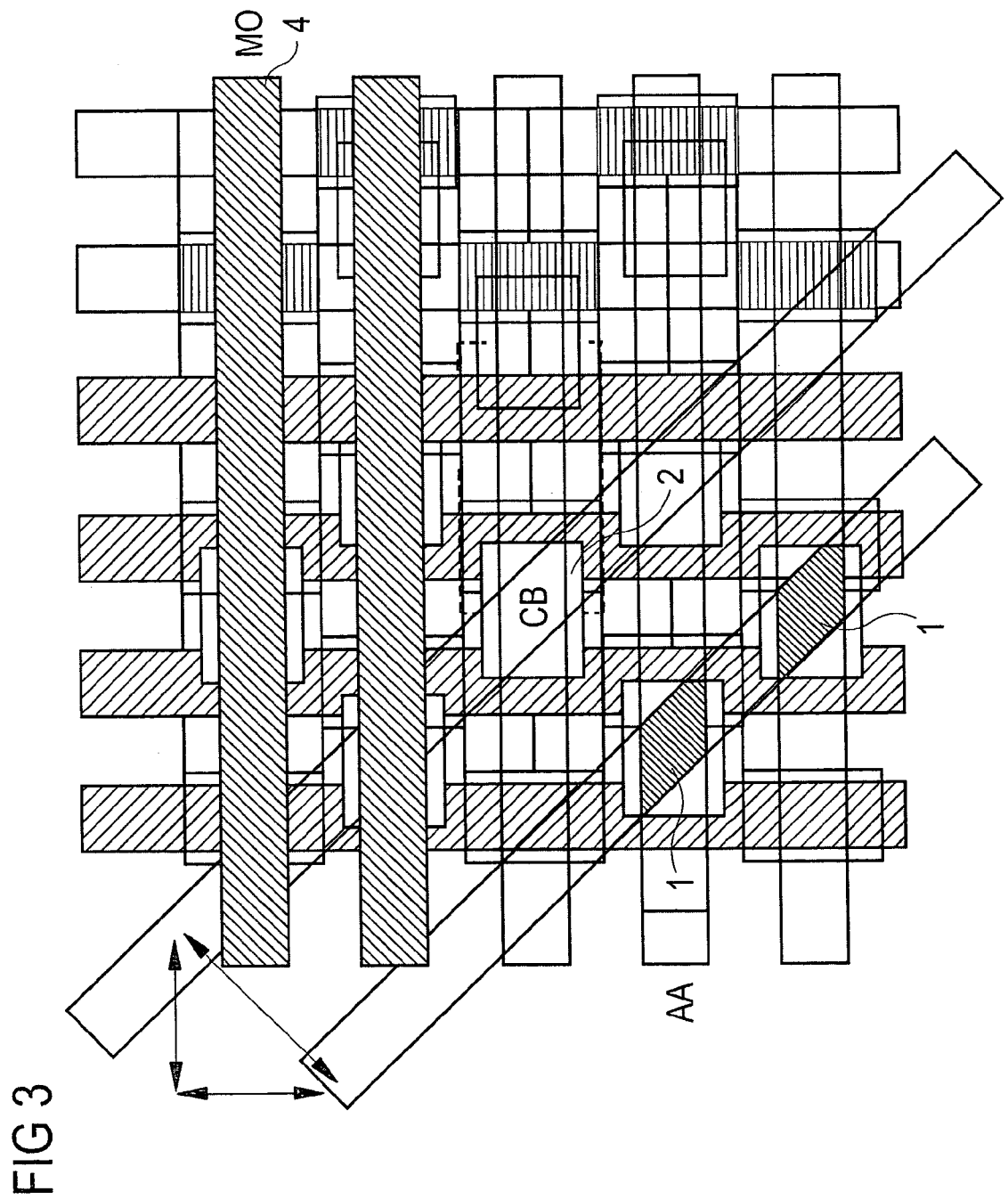
FIG. 3 shows the structure of FIG. 1 after further processing.

Once this layer has been formed, a further lithographic process step is carried out, in which a second exposure mask is used. This likewise has a parallel strip structure, with the distance between the strips being less than that in the first mask. The strips are aligned in the base layer of the chips, that is at an angle of zero degrees. After a further exposure and development process, as well as the corresponding necessary further method steps, the M0 tracks 4 as illustrated in FIG. 1 are produced. In a subsequent method step, over-etching of the space between the M0 tracks 4 leads to cutting through the CB tracks 3 located underneath it in the rotated layer at the points which are not covered by the upper M0 strip structure 4, and thus formation of the contacts 1 for the CB contact surfaces 2 at the points at which the two strip structures overlap. FIG. 3 shows the structure after removal of the exposed portions of tracks 3.

These M0 tracks 4 in the uppermost metallization layer produce the connection for the contacts 1 located underneath it for the memory cells as a row line in a memory matrix, and need not be provided by further method steps following the contact formation.

In addition to the production of the contacts by means of a lithographic process, it is also possible for the necessary structures, for example the conductor tracks for a contact-making layer, to be applied directly or for exposure of a photoresist layer to be carried out using a laser rather than by using an exposure mask.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a semiconductor device, the method comprising:
   providing a surface that includes a plurality of contacts laid out in a matrix of rows and columns;

forming a first plurality of strips over the surface, each strip in the first plurality contacting ones of the contacts disposed along a diagonal of the matrix;

forming a second plurality of strips over the surface and over the first plurality of strips, each strip in the second plurality disposed along a row of the matrix; and removing portions of the first plurality of strips not underlying the second plurality of strips.

2. The method of claim 1 wherein the first plurality of strips is formed by means of a lithographic process using a first exposure mask and wherein the second plurality of strips is formed by means of a lithographic process using a second exposure mask.

3. The method of claim 2 wherein the lithographic process uses a positive resist.

4. The method of claim 1 wherein the first plurality of strips comprises a plurality of parallel strips and wherein the second plurality of strips comprises a plurality of parallel strips.

5. The method of claim 1 wherein the angle between the first plurality of strips and the second plurality of strips is about 45 degrees.

6. The method of claim 1 wherein the strips in the second plurality of strips are corrugated.

7. The method of claim 1 wherein snips in the first plurality of strips have a different pitch than strips in the second plurality of strips.

8. The method of claim 7 wherein strips in the first plurality of strips have a width that is the same as a width of strips in the second plurality of strips and wherein a distance between strips in the first plurality of strips is different than a distance between strips in the second plurality of strips.

9. The method of claim 8 wherein the distance between strips in the first plurality of snips is greater than the distance between strips in the second plurality of strips.

10. The method of claim 1 wherein removing portions comprises over-etching a space region between the strips in the second plurality of strips.

11. The method of claim 1 wherein the semiconductor device comprises a memory array and wherein the contacts comprise memory cell contacts, and wherein the strips in the second plurality of strips line along a row line for memory cells.

12. The method of claim 11 wherein the second plurality of strips is formed in an M0 metallization.

* * * * *

UNITED STATES PATENT AND TRADEMARK OFFICE
CERTIFICATE OF CORRECTION

PATENT NO. : 7,094,674 B2 Page 1 of 1
APPLICATION NO. : 10/739477
DATED : August 22, 2006
INVENTOR(S) : Graf et al.

It is certified that error appears in the above-identified patent and that said Letters Patent is hereby corrected as shown below:

Column 6, line 10; delete "snips" insert --strips--

Signed and Sealed this

Twenty-sixth Day of December, 2006

JON W. DUDAS
*Director of the United States Patent and Trademark Office*